(12) United States Patent
Samuels et al.

(10) Patent No.: US 6,282,960 B1
(45) Date of Patent: Sep. 4, 2001

(54) MICROMACHINED DEVICE WITH ENHANCED DIMENSIONAL CONTROL

(75) Inventors: Howard R. Samuels, Newton; Jeffrey A. Farash, Holbrook, both of MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 09/097,839

(22) Filed: Jun. 16, 1998

Related U.S. Application Data

(63) Continuation of application No. 08/616,713, filed on Mar. 15, 1996, now Pat. No. 5,880,369.

(51) Int. Cl.⁷ .............................. G01P 15/125; H01G 7/00
(52) U.S. Cl. ........................................ 73/514.32; 361/280
(58) Field of Search ........................... 73/514.32, 514.18, 73/514.16, 514.01, 862.61, 862.621, 862.636, 862.637; 361/280, 283.3

(56) References Cited

U.S. PATENT DOCUMENTS

| | | | |
|---|---|---|---|
| 5,286,944 | 2/1994 | Li ........................................ | 219/69.15 |
| 5,345,824 * | 9/1994 | Sherman et al. .................. | 73/514.18 |
| 5,364,497 * | 11/1994 | Chau et al. ........................ | 156/645 |
| 5,447,067 * | 9/1995 | Biebl et al. ........................ | 73/514.32 |
| 5,447,068 * | 9/1995 | Tang .................................. | 73/514.32 |
| 5,495,761 * | 3/1996 | Diem et al. ........................ | 73/514.32 |
| 5,511,420 * | 4/1996 | Zhao et al. ........................ | 73/514.18 |
| 5,542,295 * | 8/1996 | Howe et al. ....................... | 73/514.18 |
| 5,563,343 * | 10/1996 | Shaw et al. ........................ | 73/514.18 |
| 5,565,625 * | 10/1996 | Howe et al. ....................... | 73/514.16 |
| 5,574,222 * | 11/1996 | Offenberg ......................... | 73/514.32 |
| 5,618,989 | 4/1997 | Marek ................................ | 73/1.38 |
| 5,635,638 * | 6/1997 | Geen .................................. | 73/504.04 |
| 5,646,347 * | 7/1997 | Weiblen et al. ................... | 73/514.32 |

FOREIGN PATENT DOCUMENTS

93/19343    9/1993    (WO).

OTHER PUBLICATIONS

Ohwada et al.; Groove Depth Uniformization in (110) Si Anisotropic Etching by Ultrasonic Wave and Application to Accelerometer Fabrication; (1995) Proceedings of the Workshop on Micro Electrical Mechanical Systems (MEMS), Amsterdam, IEEE,; pp. 100–105.

Offereins et al.; Methods for the Fabrication of Convex Corners in Anisotropic Etching of (100) Silicon in Aqueous KOH; (1991) Sensors and Actuators A. 25–27: pp. 9–13.

* cited by examiner

Primary Examiner—Richard A. Moller
(74) Attorney, Agent, or Firm—Hale and Dorr LLP

(57) ABSTRACT

A micromachined device is provided that establishes select dimensional relationships between micromachined structures to achieve correlation in dimensional variation among these structures.

22 Claims, 4 Drawing Sheets

MICROMACHINED DEVICE WITH ENHANCED DIMENSIONAL CONTROL

CROSS-REFERENCE TO RELATED APPLICATION

This application is a continuation of application Ser. No. 08/616,713, filed Mar. 15, 1996 now U.S. Pat. No. 5,880,369.

BACKGROUND OF THE INVENTION

The present invention relates to the field of micromachined devices and, more particularly, to dimensional control of structures within micromachined devices.

"Micromachined device," as the term is used herein, refers to a device containing a three-dimensional structure manufactured using the same photolithographic techniques and batch processing as for integrated circuits. Micromachined structures are frequently used as sensors or actuators and, in some existing applications, are used to detect and measure acceleration with piezoresistors or capacitors. In the latter case, a differential capacitor is typically used.

A differential-capacitor based acceleration sensor includes three primary micromachined elements; a central member, capacitor plates and support springs. The member, supported by springs, is positioned midway between two plates so that one capacitor is formed by a first plate and the member and a second (and equal) capacitor is formed by a second plate and the member. To maximize the sensor capacitance, the member may contain numerous fingers that are interleaved between fingers from the two plates. Various shapes and arrangements of the capacitor plates may be used. Examples of such devices are provided in commonly-owned U.S. Pat. No. 5,345,824 and U.S. patent application Ser. No. 08/347,795 now U.S. Pat. No. 5,565,625, both of which are hereby expressly incorporated by reference in their entirety for all purposes.

The sensitivity of a micromachined sensor is determined by a variety of factors, including sensor capacitance, spring constant ("k"), mass of certain elements (e.g., central member), polysilicon thickness, parasitic capacitance and variations in crystal orientation in polysilicon. Among these, spring constant and sensor capacitance are the dominant factors. The sensitivity of a micromachined sensor may vary significantly due to manufacturing variations which alter dimensions of micromachined structures within the sensor. Accordingly, some post-manufacturing calibration is typically required. Effective calibration requires an accurate determination of sensitivity, which is largely determined by accurate estimations of spring constant and sensor capacitance values.

Although the springs and capacitors of a micromachined sensor are manufactured using the same processes, variations in these processes do not necessarily affect the different structures disposed within these components the same way (i.e., each structure may vary independently in size). Such disparate dimensional variation between physically and/or functionally different structures makes it difficult to accurately estimate component values and, thereby, predict device performance.

Accordingly, a new micromachined device is required that facilitates correlation of dimensional variation between micromachined structures.

SUMMARY OF THE INVENTION

The present invention is directed to an apparatus that facilitates correlation of dimensional variation between micromachined structures by establishing select dimensional relationships between these structures. In a preferred embodiment, a micromachined device constructed according to the principles of the invention includes a first structure; a second structure disposed proximate to the first structure at a predefined distance; a third structure which is physically different from the first and second structures, and a fourth structure disposed proximate to the third structure at approximately the predefined distance, the fourth structure also being physically different from the first and second structures.

A further understanding of the nature and advantages of the invention may be realized by reference to the remaining portions of the specification and drawings.

DESCRIPTION OF SPECIFIC EMBODIMENTS

Figure 1:
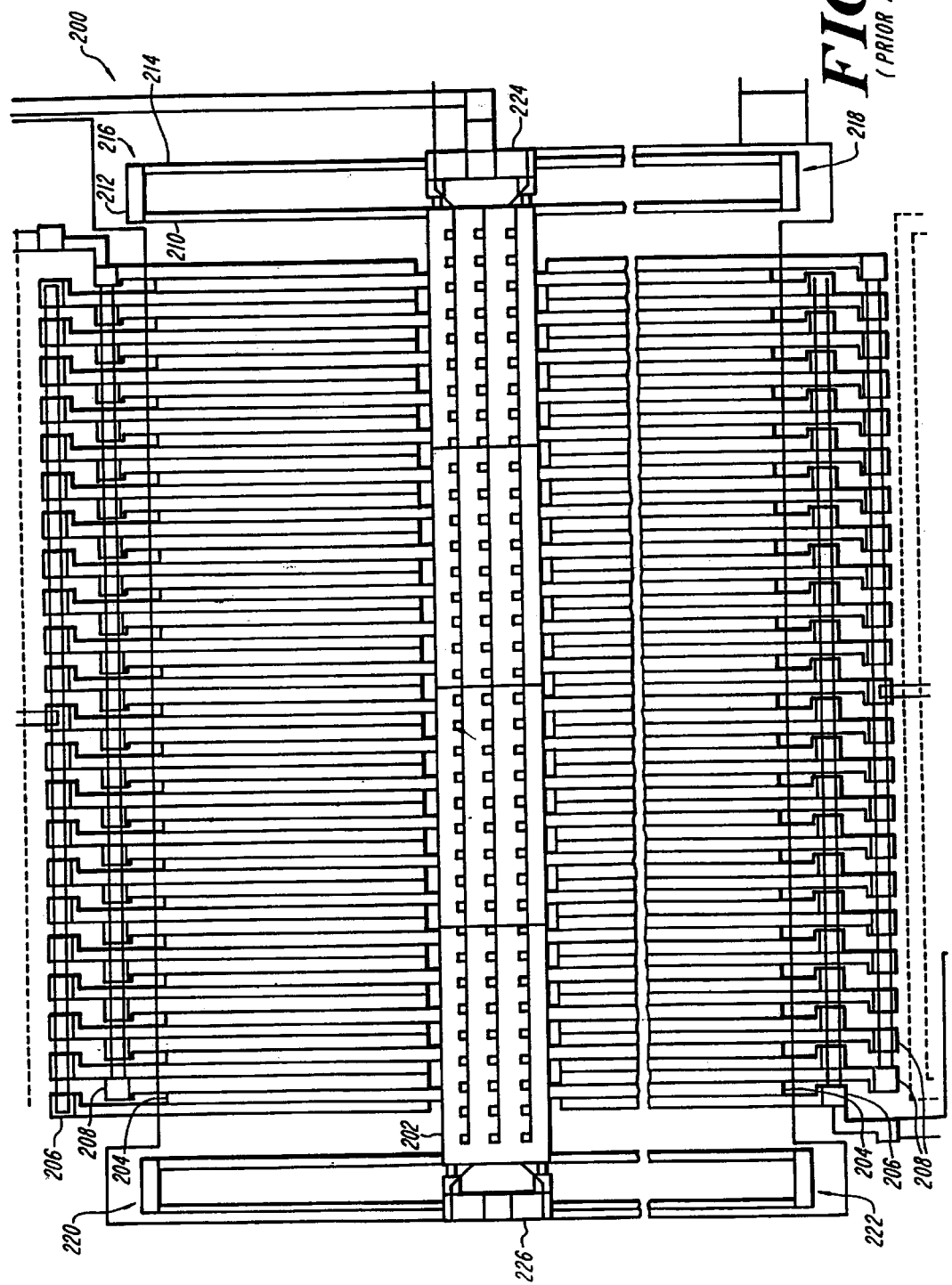
FIG. 1 is a layout diagram of an acceleration sensor used in a commercially-available accelerometer.

FIG. 1 illustrates the layout (drawn to scale), of an exemplary micromachined acceleration sensor 200. This sensor is used in a commercially available accelerometer (i.e., the "ADXL05") manufactured by Analog Devices, Inc., located in Norwood, Mass. ("Analog"). The ADXL05 is described in a data sheet published by Analog and entitled ±1 g to ±5 g Single Chip Accelerometer with Signal Conditioning—ADXL05, Rev. 0 (1995), which is hereby incorporated by reference in its entirety for all purposes.

Sensor 200 includes a movable mass with forty-four sense fingers 204, which are coupled to central member 202 and form sensor capacitors with fixed fingers 206 and 208. The distance ($d_0$) between fingers 204 and 206 (forming a capacitor C1) and fingers 204 and 208 (forming a capacitor C2) determines, to a great extent, sensor capacitance. Sensor 200 also includes springs 216–222, which couple central member 202 to an underlying substrate through anchors 224 and 226. The width (W) of spring legs 210 and 214 determines, to a great extent, the spring constant k of these sensor components.

As noted above, the sensitivity of a micromachined acceleration sensor is determined primarily by its sensor capacitance and spring constant. Although the underlying components of these factors (i.e., springs 216–222 which spring can be considered "first structures" and capacitors formed from fingers 204–208, which capacitors can be considered "second structures") are manufactured with the same processes, variations in these processes affect the structures within each component differently. This disparate effect is a direct result of the different layout environments associated with each component. Specifically, capacitor fingers 204–208 are closely surrounded by other polysilicon structures while spring legs 210 and 214 are essentially isolated from other structures as well as themselves.

According to the principles of the invention, by laying out the micromachined structures of interest (in this case, for example, fingers 204–208 and legs 210,214) such that any critical dimensions (e.g., the gap between fingers 204–208 which is defined by finger width, and the width of legs 210,214) exist in the same type of surroundings, correlation of the resulting features (e.g., finger and leg width) can be greatly improved. As discussed below, this is achieved by a combination of layout techniques which emphasize consistent spacing between existing, operating structures, and by adding new structures (i.e., "dimensional-control structures") to the layout which provide additional consistent spacing at select locations within a micromachined device.

Figure 2:
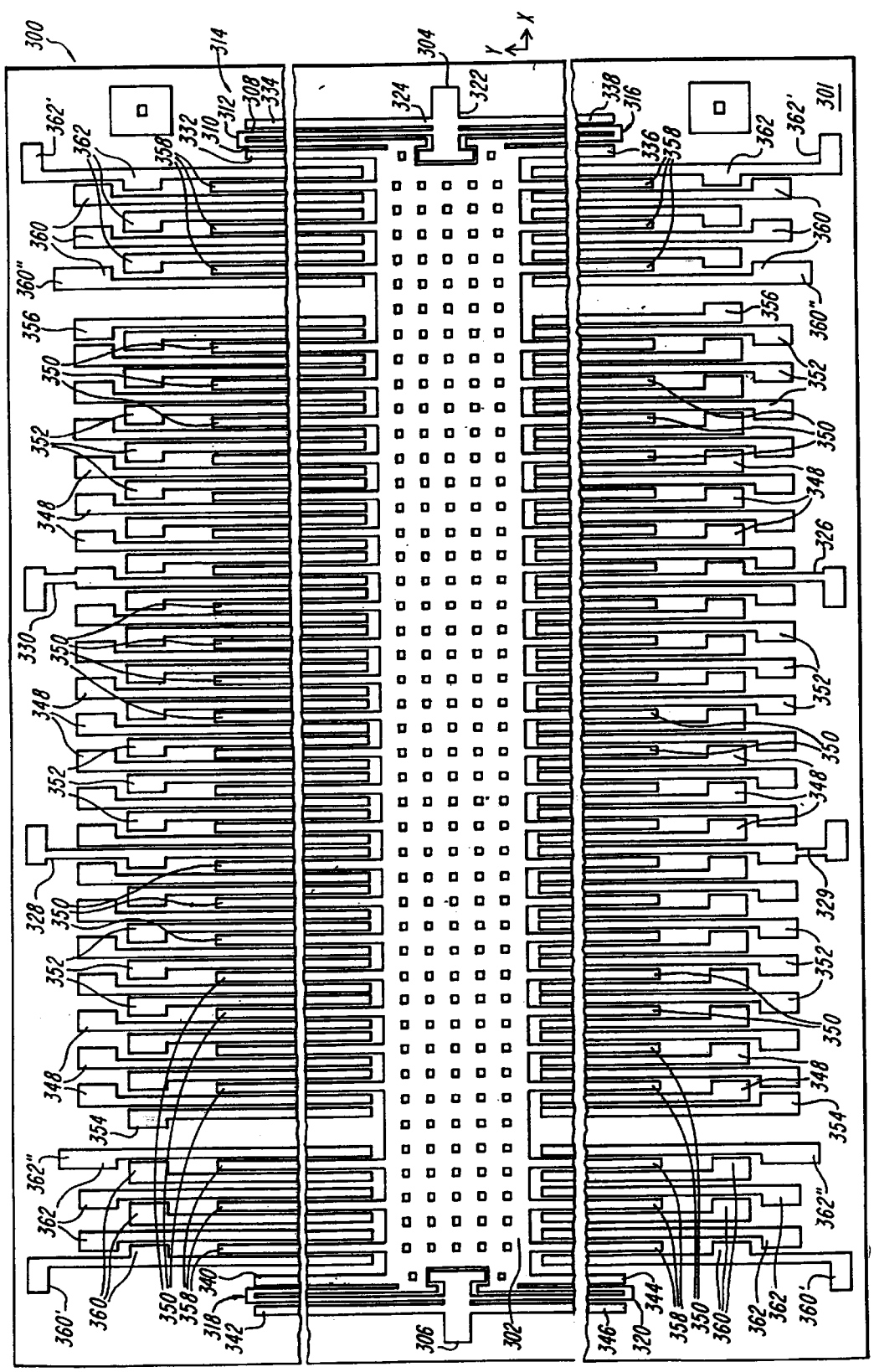
FIG. 2 is a layout diagram of an acceleration sensor constructed according to the principles of the invention.

FIG. 2 illustrates a micromachined sensor 300 (drawn to scale) which is constructed according to the principles of the invention. A central member 302 is a polysilicon structure suspended above a bootstrap diffusion layer (not shown) disposed within an underlying substrate 301. Member 302 is approximately 467 micrometers long and 57 micrometers wide. (The dimensions provided herein are merely exemplary and in no way limiting.) The bootstrap diffusion layer is formed from an n+ doped emitter diffusion region in the substrate. Member 302 is approximately parallel to the surface of substrate 301.

Member 302 is connected to anchors 304 and 306 through folded springs 314, 316 and 318, 320, respectively. Springs 314–320 are formed from polysilicon. Anchors 304, 306 are "T" shaped with a vertical portion 322 having an approximate length and width of 28.7 and 9.7 micrometers, respectively, and a horizontal crossing portion 324 having an approximate length and width of 21.7 and 4.7 micrometers, respectively. Anchors 304 and 306 are mounted on the substrate outside the bootstrap diffusion layer through small rectangular regions at the bottom of the "T". (The rest of the T is suspended above substrate 301.)

Springs 314–320 consist of legs 308, 310 and 312, all of which are approximately 2.2 micrometers wide. Long legs 308 and 310 are parallel to each other, connected at one (i.e., "external") end by short leg 312. The other (i.e., "internal") ends of long legs 308 and 310 are connected to an anchor (e.g., 304 or 306) and member 302, respectively. Long legs 308 and 310 are flexible, allowing member 302 to move along the X-axis (passing through anchors 304 and 306) in response to a force along the X-axis, as the internal ends of long segments 308 and 310 move closer together or further apart. Long segments 308 and 310 are approximately 116.7 and 98.2 micrometers long, respectively, and are separated by a gap of approximately 1.3 micrometers. Alternatively, other shapes can be used for the springs.

Disposed to the left and right of each spring 314–320 is a first dimensional-control structure (i.e., a dimensional-control finger) as shown in FIG. 2. Specifically, internal dimensional-control fingers 332, 336 (coupled to member 302) are disposed to the left of springs 314 and 316, respectively. Further, a set of second dimensional-control member or fingers 334, 338 (coupled to anchor 304) are disposed to the right of springs 314 and 316, respectively. This same relationship exists for springs 318 and 320, where external dimensional-control fingers disposed to the left (i.e., 342 and 346, respectively) are coupled to anchor 306 while internal dimensional-control fingers disposed to the right (i.e., 340 and 344, respectively) are coupled to member 302.

The distance between each dimensional-control finger and associated spring is approximately 1.3 micrometers and the width of each dimensional-control finger is approximately 3.7 micrometers. The length of fingers 332, 336, 340 and 344 is approximately 94.5 micrometers, and the length of fingers 334, 338, 342 and 346 is approximately 118 micrometers.

Extending from the sides of member 302 along the Y-axis are parallel polysilicon sense fingers 350. In sensor 300, sense fingers 350 are substantially similar (i.e., substantially the same shape and dimension); each being approximately 3.4 micrometers wide and approximately 109 micrometers long. As shown in FIG. 2, there are 21 sense fingers on each side of member 302.

To the left and right (along the X-axis) of each sense finger 350, and not connected to member 302, is a left fixed finger 348 and a right fixed finger 352, respectively. These fixed fingers are formed from polysilicon and anchored to substrate 301. Preferably, the inner set of fixed fingers and outer set of fixed fingers on each side of member 302 are approximately 124 and 144 micrometers long, respectively. Each finger 348,352 is approximately 3.4 micrometers wide and each is separated from an adjoining sense finger 350 by a gap of approximately 1.3 micrometers. Adjoining left and right fixed fingers 348 and 352 are also spaced approximately 1.3 micrometers apart, although this dimension is not as critical as the dimensions on either side of finger 350. Rather than being limited by dimensional control, the distance between fingers 348 and 352 is controlled by an electrical parameter; i.e., this distance must not be so large as to affect the electrical field lines on the inside of gaps between fingers 350–348 and 350–352.

All of the left fixed fingers 348 on each side of member 302 are connected together through a heavily n+ doped polysilicon region, as are all of the right fixed fingers 352 (regions not shown). Electrical connection to the inner set of fixed fingers on each side of member 302 is made with polysilicon microbridges 326 and 328. Similarly, electrical connection to the outer set of fixed fingers on each side of member 302 is made with polysilicon microbridges 329 and 330.

Figure 3:
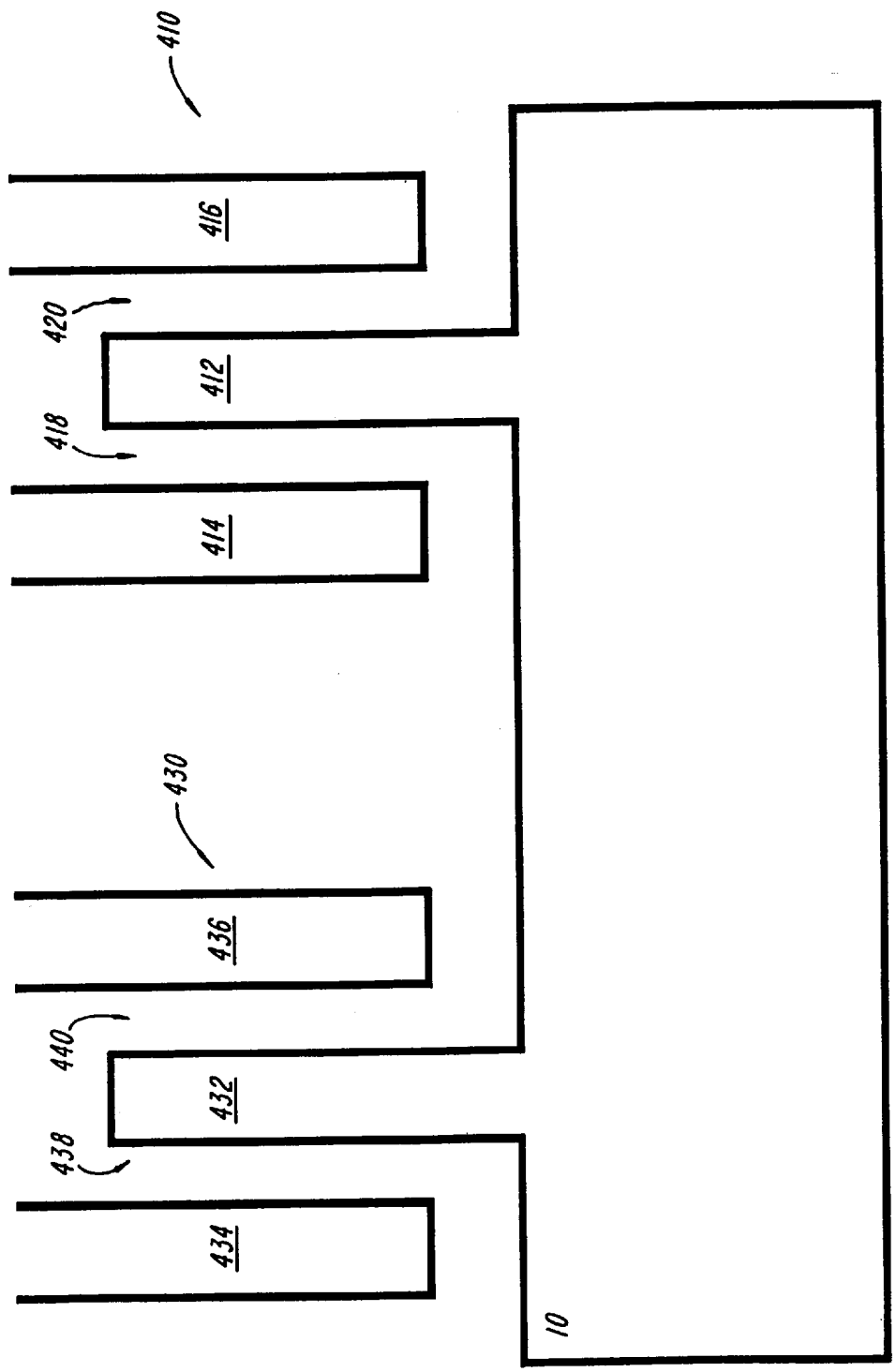
FIG. 3 is a schematic diagram of differential capacitors formed by the acceleration sensor of FIG. 2.

Referring to FIGS. 2 and 3, sense fingers 350 (which form a single electric node with central member 302) collectively form center electrode 412 of differential sense capacitor 410. Left fixed fingers 348 form left electrode 414 and right fixed fingers 352 form right electrode 416 of differential capacitor 410, which consists of left capacitor 418 and right capacitor 420. Preferably, left capacitor 418 and right capacitor 420 have the same capacitance. Each set of one sense finger 350 and its adjoining left fixed finger 348 and right fixed finger 352 forms one "cell" of differential capacitor 410, with all of the cells substantially similar and connected in parallel.

When member 302 moves to the right relative to fixed fingers 348 and 352 (in response to force applied along the X-axis), the distance between each sense finger 350 and the right fixed finger 352 of the same cell decreases, which increases the capacitance of right capacitor 420. At the same time, the distance between each sense finger 350 and the left fixed finger 348 of the same cell increases, decreasing the capacitance of left capacitor 418.

Member 302 is connected to resolving circuitry through a heavily n+ doped region of polysilicon, which extends from anchor 304. An example of resolving circuitry and a discussion of acceleration sensor operation is provided in U.S. Pat. No. 5,345,824.

To the left of the leftmost left fixed finger 348 on each side of member 302 is a right dummy finger 354. Similarly, to the right of the rightmost right fixed finger 352 on each side of member 302 is a left dummy finger 356. These dummy fingers are connected to their corresponding fixed fingers (i.e., right dummy fingers 354 are connected to right fixed fingers 352 and left dummy fingers 356 are connected to left fixed fingers 348). This ensures that end cells of differential capacitor 410 behave the same as the middle cells. More specifically, dummy fingers 354 and 356 are installed to ensure that the electrical field present at the leftmost left fixed fingers 348 and rightmost right fixed fingers 352, respectively, are the same as the electric fields found at the "middle" left and right fixed fingers 348, 352 (e.g., between microbridges 326 or 328 and 330).

The distances between (1) right dummy fingers 354 and leftmost left fixed finger 348, and (2) left dummy fingers 356 and rightmost right fixed finger 352 are subject to the same limitation. Specifically, these distances must not be so large so to affect the electrical field lines on the inside of gaps between fingers 350–348 and 350–352.

At both ends of member 302 are 6 polysilicon self-test fingers 358 (i.e., a total of 12). These fingers are approximately 3.7 micrometers wide and 109 micrometers long. Self-test fingers 358 are part of the same electric node as sense fingers 350 and the body of member 302. To the sides of each self-test finger 358, and not connected to member 302, are a left and a right polysilicon actuator finger 360 and 362, respectively. When no force is applied to member 302, self-test fingers 358 are midway between actuator fingers 360 and 362, resulting in a distance between fingers 358 and adjoining actuator fingers 360, 362 of approximately 1.3 micrometers.

The inner set of actuator fingers 360, 362 are approximately 124 micrometers long. Additionally, the outer set of actuator fingers 360, 362 are approximately 144 micrometers long. Both fingers are approximately 3.7 micrometers wide and anchored to substrate 301. Actuator fingers 360 are coupled to each other via heavily doped n+ polysilicon regions (not shown) and electrically coupled via polysilicon microbridges 360' and 360". Similarly, actuator fingers 362 are coupled to each other via heavily doped n+ polysilicon regions (not shown) and electrically coupled via polysilicon microbridges 362' and 362".

Referring to FIG. 3, self-test fingers 358 form center electrode 432 of differential self-test capacitor 430. Left actuator fingers 360 and right actuator fingers 362 form left electrode 434 and right electrode 436, respectively, of differential capacitor 430.

Like differential capacitor 410, the separation between each self-test finger 358 and its adjoining actuator fingers 360, 362 changes when sensor 300 is subject to a force along the X-axis. However, while differential sense capacitor 410 is used to measure the magnitude of the force applied to the sensor, differential self-test capacitor 430 is used to generate electrostatic forces. More specifically, actuator fingers 360, 362 are used to apply an electrostatic force to self-test finger 358 to deflect central members 302 for testing purposes.

Capacitor fingers 348–362 and springs 314–320 are "operating" structures; i.e., they provide an operating function (e.g., electrical or mechanical) and may also provide dimensional control through consistent spacing. In contrast, fingers 332–346 are dimensional control structures; i.e., their sole purpose is to provide dimensional control through the creation of consistent spacing at select locations within the device (e.g., next to electrical operating structures, mechanical operating structures, etc.). Sensor 300 is constructed so that certain critical spacing dimensions are uniformly maintained at a predefined distance; i.e., spacing between sense capacitor fingers (i.e., between fingers 350–348 and 350–352) and spacing between and bordering spring legs 308 and 310. This is achieved by ensuring existing operating structures (e.g., fingers 348–352 and spring legs 308,310) are configured to maintain uniform distances between each other (such as by reducing the distance between legs 308 and 310 to approximately the same distance as between fingers 350–348 and 350–352) and by adding certain dimensional-control structures (e.g., fingers 332–346), which establish these same uniform distances at select locations within the sensor.

The dimensional-control structures in sensor 300 create a new spacing environment (i.e., spacing bordering legs 308, 310) with new structures (i.e., internal and external fingers 332–346) that differ from existing structures. These new structures establish a dimensional relationship (i.e., uniform spacing) between functionally and physically different micromachined structures (i.e., fingers and springs). As noted above, the uniform spacing between sense capacitor fingers 348–352 and folded spring legs 308,310 is approximately 1.3 micrometers. This dimension, which represents a predefined distance selected by a designer, is created from a mask spacing of about 1.0 micrometers.

Referring to FIG. 2, every sense finger 350 is longitudinally bordered by left fixed finger 348 and right fixed finger 352. Accordingly, each capacitor sense finger 350 used to create differential capacitor 410 (FIG. 3) is longitudinally bordered by a uniform space or gap (i.e., "$d_0$") of approximately 1.3 micrometers. Additionally, all spring legs 308 and 310 are disposed next to each other maintaining the same uniform distance of approximately 1.3 micrometers. These legs are longitudinally bordered by an internal dimensional-control finger (i.e., 332, 336, 340 or 344) and external dimensional-control finger (i.e., 334, 338, 342 or 346). Accordingly, each spring leg 308 or 310 is longitudinally bordered by a uniform space or gap of approximately 1.3 micrometers.

Figure 4:
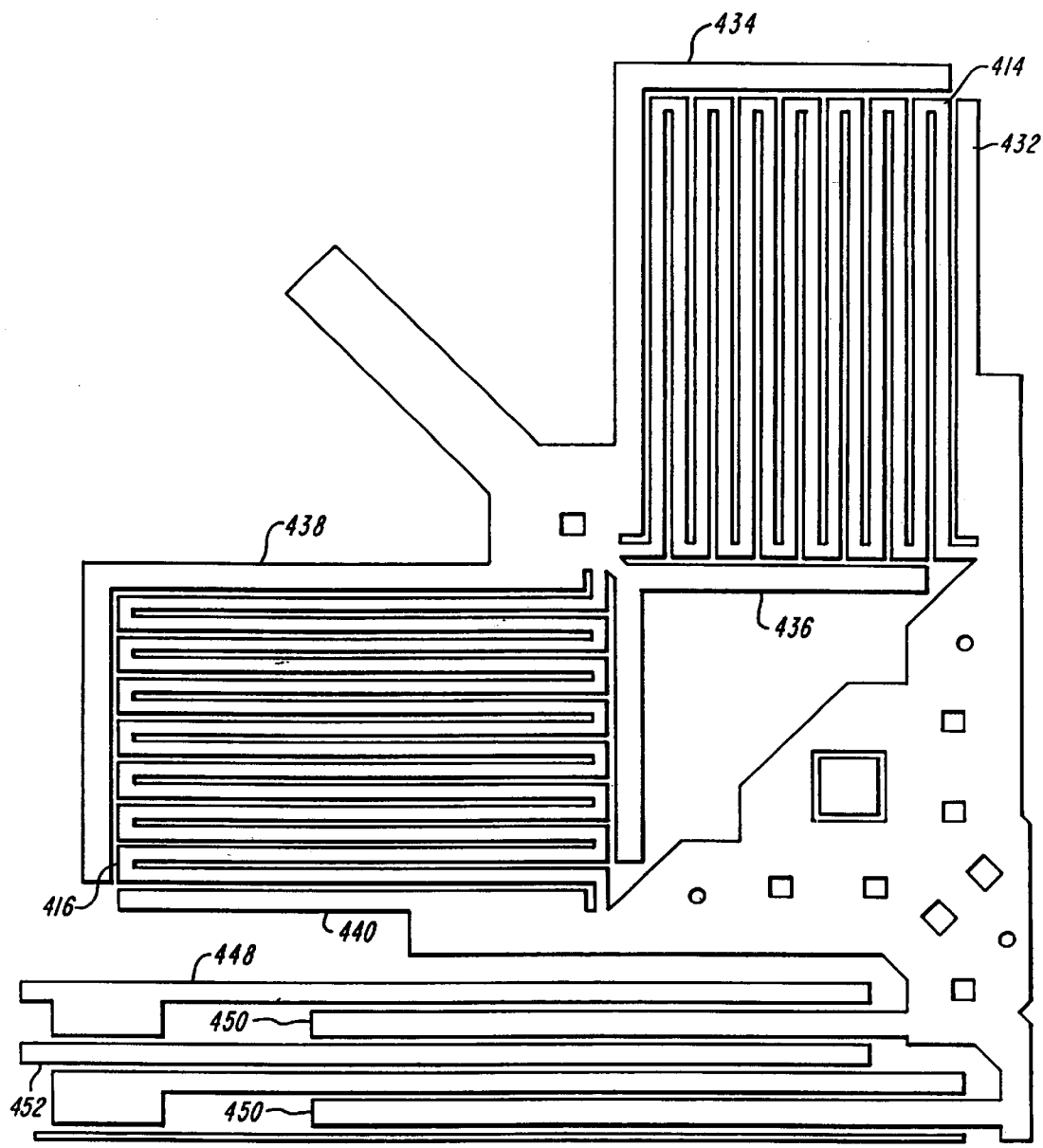
FIG. 4 is a layout of an alternative embodiment of a micromachined structure constructed according to the principles of the invention.

Springs 314–320 represent only one example of an applicable spring configuration. These structures may also be configured in more complex shapes, such as in a series of folds like springs 414, 416 of FIG. 4. Referring to this figure, complex springs 414, 416 are surrounded by dimensional-control structures 432–440 to achieve approximately the same uniform spacing experienced between capacitor fingers 450–448 and 450–452. Further, the spacing between the series of folds in each spring 414 and 416 also provide approximately the same uniform spacing as between capacitor fingers 448–452. Alternatively, these springs need not be folded at all (see, U.S. Pat. No. 5,345,824).

The spacing uniformity maintained in sensor 300 represents a beneficial dimensional relationship between structures disposed within this device. This relationship facilitates correlation of dimensional variation between functionally and/or physically different micromachined structures. Physically different structures are those having different dimensions and/or shape (e.g., fingers 350 and springs 314–320). Similarly, this relationship facilitates correlation of dimensional variation between functionally and/or physically similar micromachined structures. Physically similar structures are those having substantially similar dimensions and shape (e.g., a plurality of fingers 350). By maintaining uniform spacing between and among sense capacitor fingers and, for example, folded spring legs, manufacturing processes applied to both structures (e.g., etching or photolithography) and variations in such processes (e.g., overetching) affect the physical dimensions of these structures (e.g., spring width and finger width) in a highly correlated manner.

In the embodiment of FIG. 2, correlation between spring width variation and finger width variation (during manufacturing) improved by a factor of four over previously-known sensor configurations that did not include any dimensional relationship between capacitor fingers and springs (see, FIG. 1). As such, the correlation of dimensional variation in springs 314–320 (created by manufacturing variations) with the dimensional variation in fingers 350 improved from 32% of the allowed tolerance to 8% of such tolerance. The process used to manufacture sensor 300 is described in commonly-owned U.S. Pat. Nos. 5,314,572, 5,326,726 and 5,364,497, each of which is hereby expressly incorporated by reference in its entirety for all purposes.

In summary, by maintaining spacing uniformity among structures within certain components (i.e., sense capacitors and springs) of a micromachined device, the physical dimensions of these structures formed by the same manufacturing processes tend to track each other. For example, in sensor 300 of FIG. 2, if sense fingers 350 are thicker than normal by a specific amount due to manufacturing variations (and thus the space between them is thinner than normal), then springs 314–320 are also thicker than normal by approximately the same amount. Conversely, when such fingers are thinner than normal by a specific amount, the supporting springs are also thinner than normal by approximately the same amount.

Knowing the relationship between spring dimensions and capacitor finger spacing, it is possible to analyze and predict the performance of sensor 300 more accurately than if the dimensions were uncorrelated. For example, this relationship may be utilized to determine device sensitivity of an acceleration sensor. Alternatively, the relationship can be used to reveal how much electrostatic force is generated by a given voltage on actuator fingers 360, 362 (which is determined from capacitor finger spacing). In short, select performance characteristics for any micromachined device can be forced to correlate based on dimensional relationships between select structures.

Through the use of the layout techniques described above (i.e., consistent spacing between two or more existing, operating structures and/or consistent spacing between an existing operating structure and a new dimensional-control structure), dimensional relationships are established between structures that can be exploited to infer physical characteristics of select structures through a single, empirical measurement. For example, by measuring the peak output (i.e., resonant) frequency of an acceleration sensor such as sensor 300, it is possible to infer tether dimensions, capacitor plate spacing and beam mass. These values may then be used to determine the sensitivity of the device through conventional electromechanical analysis.

More specifically, the resonant frequency of sensor 300, defined by equation (1), is a function of at least three variables: spring constant "k" (defined by the geometry and composition of the spring) beam mass m (where "m" includes the mass of central member 302 and contiguous structures) and capacitor plate spacing. The procedure used to measure this frequency is well known to those having ordinary skill in the art. After measuring the resonant frequency "$f_0$" of sensor 300, equation (1) may be solved for an approximate value of k/m. If the layout dimensions of the acceleration sensor springs correlate with the layout dimensions of the capacitor fingers (and therefore the features which determine variations in m), then conventional electromechanical analysis will yield the values of spring width (W) and capacitor finger gap ($d_0$) based on the value of k/m.

$$f_0 = (k/m)^{1/2}/2\pi \qquad (1)$$

Since the spacing dimensions longitudinally bordering legs 308 and 310 are essentially the same as the spacing dimensions longitudinally bordering fingers 348–352, changes in the former resulting from manufacturing variations may be inferred to the latter. The foregoing analysis takes advantage of this relationship to use the ratio k/m to more accurately determine the values $d_0$ and W. These values may be used in conventional electromechanical analysis to determine, among other things, the sensitivity of sensor 300. In summary, as a result of the structural relationships in sensor 300, a single indirect measurement (i.e., resonant frequency) can provide information about individual component dimensions which are necessary to determine sensitivity and thereby accurately calibrate sensor 300.

In addition to the foregoing, the consistent spacing established in sensor 300 affects wall or thickness geometry. For example, it is desirable for springs 314–320 to have vertical walls in a cross-section view. If there is a slope or curvature to the walls of the spring, then the spring constant of the device is affected greatly. Provided the manufacturing process of sensor 300 can be controlled to ensure that sense fingers 350 have vertical walls, then springs 314–320 will also have vertical walls since the environment about the springs is the same as that about the sense fingers (i.e., through the use of fingers 332–346 and a reduction of distance between legs 308 and 310 to a predefined amount).

It is to be understood that the above description is intended to be illustrative and not restrictive. Many variations to the above-described micromachined device will be apparent to those of skill in the art. For example, while the description has been made primarily with reference to accelerometer design, it will be apparent that the device would have application in the design of any technology that is micromachined, such as micromachined gyroscopes, pumps, motors and resonant structures. Any structure of a micromachined device may be correlated in accordance with the principles of the invention. The scope of the invention, therefore, should be determined not with reference to the above description but, instead, with reference to the appended claims, along with their full scope of equivalence.

What is claimed is:

1. A micromachined device comprising:
   a substrate;
   a movable mass suspended over the substrate and having a central member extending along an axis;
   a spring structure coupled to the movable mass for performing a mechanical spring function, the spring structure including a first leg and a second leg;
   a first structure having an elongated portion extending parallel and next to the first leg and spaced a distance d from the first leg, the first structure not performing the spring function;
   a plurality of sense fingers extending perpendicular to the axis away from the central member; and
   a plurality of fixed fingers, each disposed next to a respective sense finger at approximately the distance d.

2. The device of claim 1, wherein the first leg is parallel to and spaced from the second long leg a distance equal to approximately the distance d.

3. The device of claim 1, further comprising a second structure having an elongated portion parallel to the second leg of the spring structure at approximately the distance d, wherein the second structure does not perform the spring function.

4. The device of claim 1, wherein each of the sense fingers is disposed between a first fixed finger and a second fixed finger, the fixed fingers being fixed relative to the substrate, each sense finger and adjacent first and second fixed finger forming a differential capacitor.

5. The device of claim 4, wherein each sense finger is spaced a distance d from the first and second fixed fingers.

6. The device of claim 5, wherein the first fixed fingers are electrically coupled together, and the second fixed fingers are electrically coupled together.

7. The device of claim 4, wherein the distance d is about 1.3 microns.

8. The device of claim 1, wherein the first and second legs extend perpendicular to the axis.

9. The device of claim 1, wherein the first and second legs extend parallel to the axis.

10. The device of claim 1, wherein the spring includes at least third and fourth legs, the first, second, third, and fourth legs being parallel to each other and connected to form a folded spring with at least four parallel legs.

11. The device of claim 10, wherein each leg is spaced the distance d from an adjacent leg.

12. A micromachined device comprising:

a substrate;

a first structure suspended over the substrate and performing a mechanical function, the first structure having a first side and a second side, the first structure being positioned relative to any nearby components such that the spacing to other components in the device next to the first and second sides is set at a predefined distance; and a second structure suspended over the substrate and coupled to the first structure, the second structure performing an electrical function and having a first external side that faces outwardly from the second structure, the second structure being laid out so that the spacing to components next to the external side is set at the predefined distance, whereby a dimensional relationship is established between the first and second structures.

13. The device of claim 12, wherein the first structure is a spring.

14. The device of claim 13, wherein the spring includes a first leg having the first side, and a second leg having the second side, wherein the second leg is parallel to the first leg.

15. The device of claim 14, wherein the first leg is spaced from the second leg approximately the predefined distance.

16. The device of claim 14, wherein the spring further includes a third leg and a fourth leg, the four legs forming at least part of a folded spring.

17. The device of claim 14, wherein the second structure includes a sense finger, the device further comprising fixed fingers that are fixed relative to the substrate, the sense finger between the fixed fingers to form a differential capacitor.

18. The device of claim 17, wherein the sense finger is spaced from each fixed finger a distance d, and the first and second legs are spaced the distance d.

19. The device of claim 12, wherein the first structure is a spring, wherein the second operating structure includes a sense finger, the device further comprising fixed fingers that are fixed relative to the substrate, the sense finger between the fixed fingers to form a differential capacitor.

20. A micromachined device comprising:

a substrate;

a movable mass suspended in a plane over and parallel to the substrate and movable along a first axis, the movable mass including a beam elongated along the first axis, and a plurality of parallel movable fingers arranged in a row extending away from the beam and perpendicular to the first axis;

a first plurality of fixed fingers that are stationary with respect to the substrate, the first plurality of fixed fingers being on one side of the row of movable fingers to form a first capacitance, each of the first plurality of fixed fingers being spaced a distance d from one of the movable fingers;

a second plurality of fixed fingers that are stationary with respect to the substrate, the second plurality of fixed fingers being on the other side of the row of movable fingers to form a second capacitance, each of the second plurality of fixed fingers being spaced a distance d from one of the movable fingers;

spring anchored to the substrate and coupled to the movable mass to allow the mass to move relative to the substrate, the spring having first and second legs parallel to each other and perpendicular to the first axis for performing a spring function; and a dimensional control structure having an elongated side and formed next to the first long leg of the spring and spaced from the first leg by the distance d, wherein the dimensional control structure does not perform the spring function.

21. The device of claim 20, wherein the first and second legs are parallel and spaced apart the distance d.

22. The device of claim 20, wherein the first and second legs are part of a folded spring structure.

* * * * *